United States Patent
Hashio et al.

(10) Patent No.: US 7,663,358 B2
(45) Date of Patent: Feb. 16, 2010

(54) CURRENT SENSOR AND MOLDING METHOD THEREOF

(75) Inventors: Shinichi Hashio, Shimada (JP); Shingo Nomoto, Shimada (JP)

(73) Assignee: Yazaki Corporation, Tokyo (JP)

( * ) Notice: Subject to any disclaimer, the term of this patent is extended or adjusted under 35 U.S.C. 154(b) by 48 days.

(21) Appl. No.: 12/000,501

(22) Filed: Dec. 13, 2007

(65) Prior Publication Data

US 2008/0186021 A1    Aug. 7, 2008

(30) Foreign Application Priority Data

Dec. 20, 2006  (JP) .............................. 2006-342542

(51) Int. Cl.
*G01R 15/20* (2006.01)
*B29C 45/14* (2006.01)

(52) U.S. Cl. .................................. 324/117 R; 264/254

(58) Field of Classification Search ............. 324/117 H, 324/117 R, 127, 251; 338/32 R, 32 H; 264/254
See application file for complete search history.

(56) References Cited

U.S. PATENT DOCUMENTS

| | | | |
|---|---|---|---|
| 6,515,468 B1 * | 2/2003 | Morimoto et al. ....... | 324/117 H |
| 6,781,359 B2 * | 8/2004 | Stauth et al. ............ | 324/117 H |
| 7,084,617 B2 * | 8/2006 | Ozaki et al. ............. | 324/117 H |
| 7,106,046 B2 * | 9/2006 | Nagano et al. .......... | 324/117 H |
| 2004/0080308 A1 * | 4/2004 | Goto ...................... | 324/117 H |

FOREIGN PATENT DOCUMENTS

| | | |
|---|---|---|
| JP | 2001-066328 | 3/2001 |
| JP | 2005-308527 | 11/2005 |
| JP | 2006-078255 | 3/2006 |

* cited by examiner

*Primary Examiner*—Ernest F Karlsen
(74) *Attorney, Agent, or Firm*—Edwards Angell Palmer & Dodge LLP

(57) ABSTRACT

A current sensor which can measure accurately current of a wide range, at low cost. A C-shaped shield plate is positioned around a flow direction of a current of the bus bar. When the current flows through the bus bar, magnetic flux density of a magnetic field is generated. A magneto-electronic conversion element detects the magnetic flux density of the magnetic field, and converts the magnetic flux density into an electric signal. Furthermore, the magneto-electronic conversion element is arranged near a position where the previously measured magnetic flux density of the magnetic field, which is generated when a current flows through the bus bar, is minimized between the conductor and the shield plate.

5 Claims, 6 Drawing Sheets

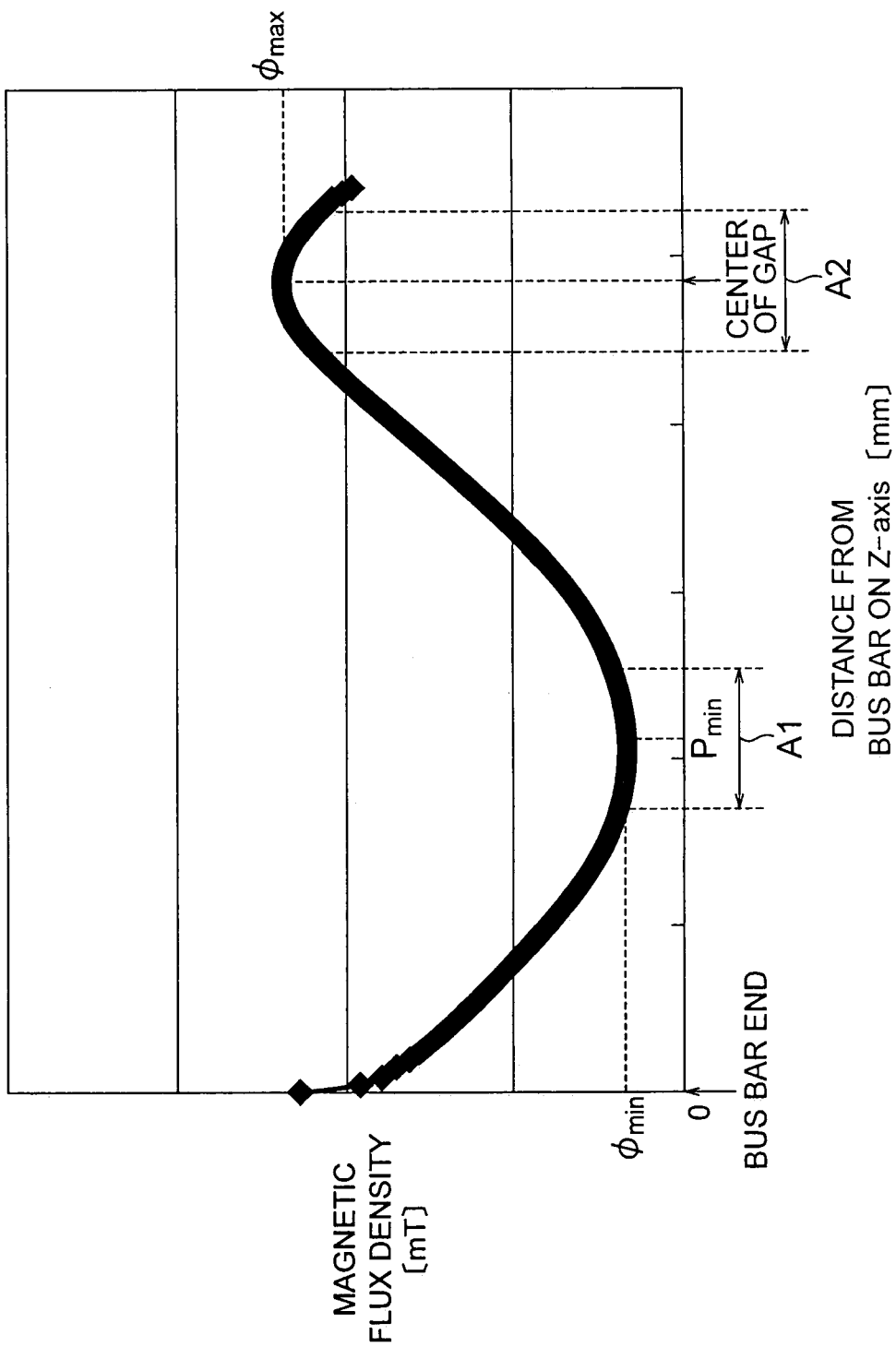

CURRENT SENSOR AND MOLDING METHOD THEREOF

The priority application Number Japan Patent Application No. 2006-342542 upon which this patent application is based is hereby incorporated by reference.

BACKGROUND OF THE INVENTION

1. Field of the Invention

The present invention relates to a current sensor and a molding method thereof, and especially to a current sensor having a conductor through which a current flows, a shield plate of ring shape and a magneto-electronic conversion element and a molding method thereof. The shield plate is arranged around a flow direction of the current. The magneto-electronic conversion element detects magnetic flux density of a magnetic field which is generated when the current flows through the conductor, and converts the magnetic flux density into an electric signal.

2. Description of the Related Art

A current sensor shown in FIG. 9 is generically known as the above mentioned current sensor. (For example, see the patent documents 1-3). As shown in FIG. 9, the current sensor has a bus bar 1 as a conductor through which a current flows, a core 2 of ring shape as a shield plate and a magneto-electronic conversion element 3. The core 2 is arranged around a flow direction Y1 of a current of the bus bar 1. The magneto-electronic conversion element 3 detects magnetic flux density of a magnetic field which is generated when the current flows through the conductor, and converts into an electric signal. The magneto-electronic conversion element 3 is arranged in a gap mounted in the core 2.

When a current flows through the bus bar 1, the above mentioned current sensor generates a magnetic field of magnetic flux density according to the current thereof. The magnetic conversion element 3 converts magnetic flux density of a magnetic field which is converged by the core 2 into an electric signal, and outputs a signal according to the current. Furthermore, the core 2 shields an effect on the magnetic field from an outside.

The magnetic flux density of the magnetic field, which is generated in the gap of the core 2, peaks at the central part of the gap, and decreases quickly toward the end part of the gap. Consequently, a case and a filter (resin) are expanded and contracted depending on a surrounding temperature. When a position of the magneto-electronic conversion element 3 moves in the gap, the magnetic flux density of the magnetic conversion element 3 is changed. Thereby, an output of the magneto-electronic conversion element 3 is changed. As a result, a current can not be measured accurately.

Linearity of the current flowing into the bus bar 1 cannot be maintained so that the core 2 magnetically saturates immediately when the gap is small. For this reason, a current range which can be measured by the current sensor is narrow.

According to the above problem, heretofore, by increasing the gap area and keeping a portion which a change of magnetic flux density is equalized with, magnetic-saturation does not occur when a large current flows. In general, after a core winds annularly a zonal member configured with anisotropic silicon steel, the core is formed by cutting the gap portion. Also, the core is formed by laminating multiple plate members having a permalloy which is cut in C-shaped. As discussed previously, it is required to increase number of turns of the zonal member and laminations of the plate member so that the gap area is increased. Thereby, it causes an increase in cost.

Patent Document 1:
Japan published patent application 2006-78255
Japan published patent application 2005-308527
Japan published patent application 2001-66328

SUMMARY OF THE INVENTION

The present invention provides a current sensor, which can measure accurately a current in extensive range, at low cost.

An applicant searched for a current sensor which can measure a wide range of a current accurately. As a result, the applicant discovered that a change of magnetic flux density near a minimum position of the magnetic flux density, which is generated when the current flows through a conductor between the conductor and a shield plate, is flat. That is, the applicant found that the change of the magnetic flux density in accordance with variation of an arranging position is small.

According to a first aspect of the present invention, a current sensor has a conductor through which a current flows, a C-shaped shield plate, and a magneto-electronic conversion element. The shield plate is positioned around the conductor. The magneto-electronic conversion element detects magnetic flux density of a magnetic field which is generated when the current flows through the conductor, and converts into an electric signal. The magneto-electronic conversion element is arranged near a position where the previously measured magnetic flux density of a magnetic field, which is generated when the current flows through the conductor, is minimized between the conductor and the shield plate.

According to a second aspect of the present invention, the current sensor has a wiring board on which the magneto-electronic conversion element is mounted, a holder sealing the wiring board and a chassis sealing the holder. The wiring board has an outer side surface pressed in the shield plate and a pressing groove arranged in the outer surface. the conductor is pressed into the pressing groove.

According to a third aspect of the present invention, the shield plate has a gap along the flow direction of the current.

According to a fourth aspect of the present invention, the invention is a molding method of a current sensor. The current sensor has a conductor through which a current flows, a C-shaped shield plate and a magneto-electronic conversion element. The shield plate is positioned around the conductor. The magneto-electronic conversion element detects magnetic flux density of a magnetic field which is generated when the current flows through the conductor, and converts the magnetic flux density into an electric signal. The molding method of the above current sensor is as below. In condition that a wiring board on which the magneto-electronic conversion element is mounted is inserted in a die for holder, a molding material is injected into a die for the holder. The holder sealing the wiring board is molded. Then, the conductor is inserted in a pressing groove arranged in an outer side surface of the holder. Thereafter, the outer side surface of the holder is pressed in the shield plate and a holder assembly is molded. In condition that the holder assembly is inserted in a die for a chassis, a molding material is injected in the die for the chassis. And then, a chassis sealing the holder assembly is molded.

According to the invention, the magneto-electronic conversion element can be arranged in a position with which the change of the magnetic flux density is equalized. Also, by arranging the magneto-electronic conversion element outside of the gap of the shield plate, influence on magnetic-saturation of the shield plate can be reduced. Thereby, a wide range of a current can be measured accurately. Even if the gap area is not large, a cost can be reduced so as to measure a wide range of a current accurately.

According to the invention, the wiring board, the shield plate and the bus bar can be held securely to the chassis. Thereby, position of the wiring board, the shield plate and the bus bar can be prevented from moving, and the current sensor can measure accurately a current further.

According to the invention, the shield plate can be prevented from doing magnetic-saturation by a small current. Thereby, the current sensor can measure a wide range of a current accurately.

The above and other objects and features of this invention will become more apparent from the following description taken in conjunction with the accompanying drawings.

BRIEF DESCRIPTION OF THE DRAWINGS

FIG. 2 is a graph showing relations between a distance from a bus bar on axis perpendicular to the bus bar passing a center of a gap and magnetic flux density;

DESCRIPTION OF THE PREFERRED AN EXEMPLARY EMBODIMENT

Figure 1A:
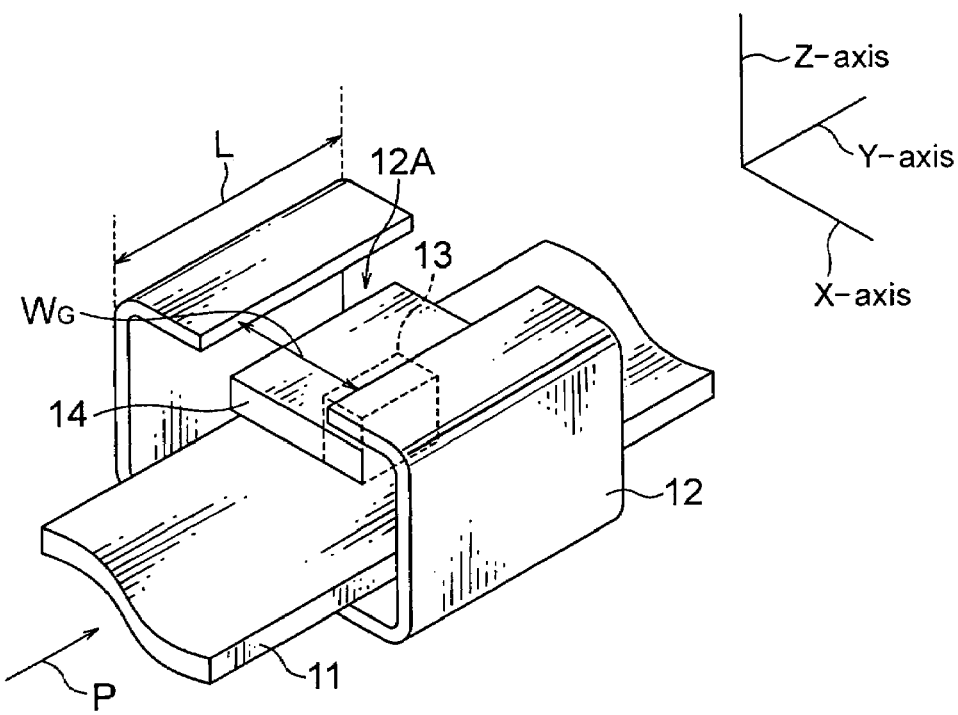
FIG. 1A is a perspective view of showing one embodiment of a current sensor of the present invention.
Figure 1B:
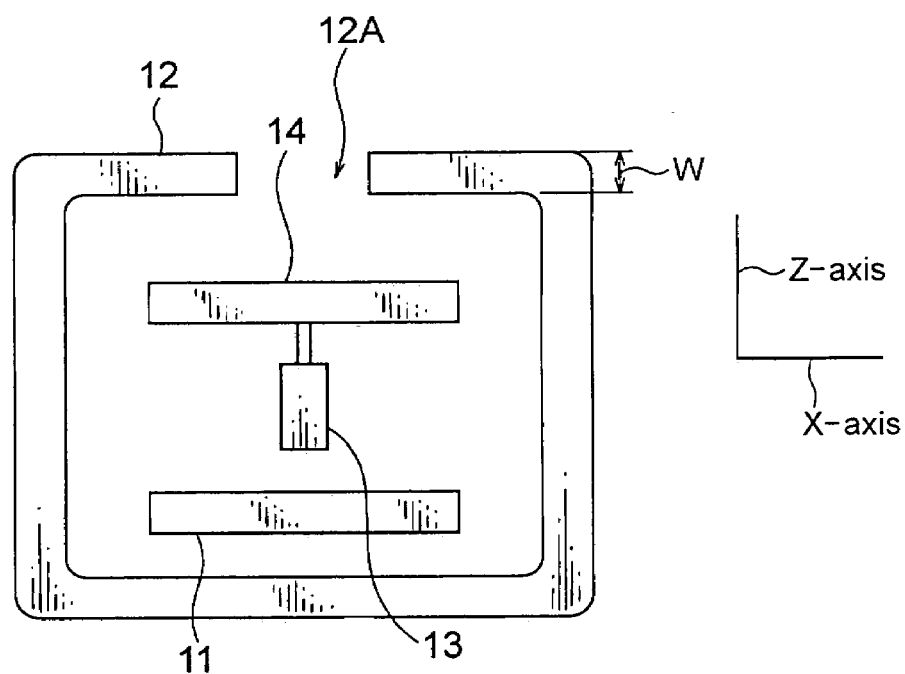
FIG. 1B is a drawing viewed from arrow P in the current sensor shown in FIG. 1A.

A first embodiment of the present invention is explained by referring to the drawings. FIG. 1A is a perspective view showing one embodiment of a current sensor of the present invention. FIG. 1B is a drawing viewed from arrow P in the current sensor shown in FIG. 1A. As shown in FIGS. 1A and 1B, the current sensor has a bus bar 11 as a conductor, a shield plate 12, a magneto-electronic conversion element 13 and a wiring board 14. In FIGS. 1A and 1B, Y-axis shows a flow direction of a current of the bus bar 11. Z-axis shows a direction headed from the bus bar 11 to the magneto-electronic conversion element 13. X-axis shows a direction perpendicular to both axes of Y-axis and Z-axis.

The bus bar 11 is a conductor of plate for passing a current. The shield plate 12 is made by pressing one metal plate, and has a gap 12A in one side of a rectangular frame shape. The shield plate 12 is positioned around Y-axis of a flow direction of the current of the bus bar 11. Also, the shield plate 12 is arranged in a position where the gap 12A is positioned on the Z-axis. That is, the bus bar 11, the magneto-electronic conversion element 13 and the gap 12A are arranged on Z-axis side by side. The bus bar 11 is arranged in a side away from the gap 12A in the shield plate 12.

The magneto-electronic conversion element 13, for example, includes a hall element. The magneto-electronic conversion element 13 detects magnetic flux density of a magnetic field which is generated when a current flows through the bus bar 11, and converts the magnetic flux density to an electric signal. The magneto-electronic conversion element 13 is mounted on the wiring board 14. When a current flows through the bus bar 11, the above mentioned current sensor generates a magnetic field of magnetic flux density according to a current thereof. The magnetic conversion element 13 converts the magnetic flux density of the magnetic field, which is generated when a current flows through the bus bar 11, into an electric signal, and outputs a signal according to the current.

Inventors measured magnetic flux density on Z-axis when a current of 100 [A] flows through the bus bar 11, and researched a relation between the distance from the bus bar 11 on Z-axis and magnetic flux density. Results are shown in FIG. 2. As shown in FIG. 2, the magnetic flux density of the magnetic field decreases with distance from the bus bar 11, and becomes minimum value Ømin. Thereafter, by effects of leakage flux from the shield plate 12, the magnetic flux density increases as magnetic flux density of the magnetic field approaches the gap 12A. As a result, the magnetic flux density becomes maximum value Ømax in a central part of the gap 12A.

As is clear from FIG. 2, a change of the magnetic flux density in an area A1 near a position Pmin where the magnetic flux density becomes minimum value Ømm is flat compared with an area A2 where the magnetic flux density becomes a maximum value. That is, the change of the magnetic flux density according to moving an arranging position in the area A1 is smaller than the area A2 regardless of a width size W of the shield plate 12.

In embodiments of the present invention, the magneto-electronic conversion element 13 is arranged in a position Pmin where the previously measured magnetic flux density becomes minimum value Ømin. The position Pmin minimizing the magnetic flux density differs by each production.

In such as arranging, even if an arranging position of the magneto-electronic conversion element 13 moves a little, the magneto-electronic conversion element 13 can be arranged in the area A1 that the change of the magnetic flux density is flat. Therefore, by changing of a surrounding temperature, a case holding the magneto-electronic conversion element 13 and a filter (resin) are expanded and contracted. Even if the arranging position of the magneto-electronic conversion element 13 moves, as described above, the change of the magnetic flux density is small. Thereby, a current can be measured accurately so that an output of the magneto-electronic conversion element 13 hardly changes.

Figures 3, 4, 5:
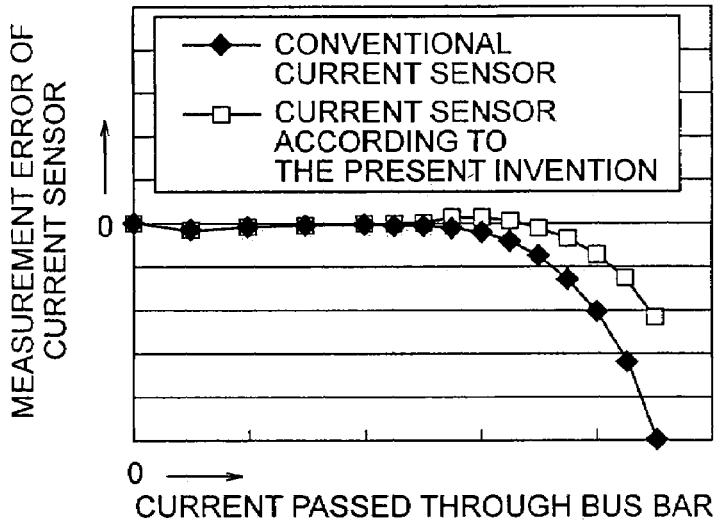
FIG. 3 is a graph showing relations between a current passed through the bus bar and a measurement error in the current sensor of the embodiments and in a conventional current sensor.
FIG. 4 is a graph showing relations between a size of a shield plate in Y-axis direction and the measurement error.
FIG. 5 is a perspective view of the shield plate in other embodiments.
Figure 9:
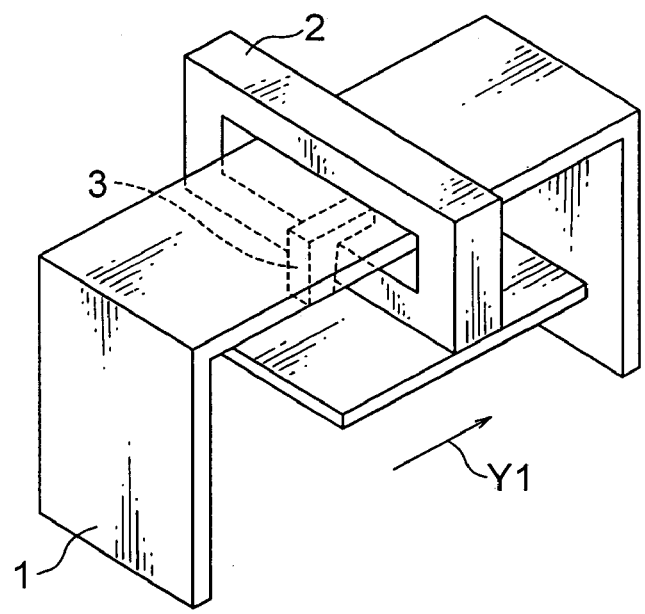
FIG. 9 is a perspective view showing an example of a conventional current sensor.

As mentioned above, the applicant investigated a relation between a current passed through the bus bar 11 and a measurement error, in the current sensor shown in FIG. 1 of embodiments of the present invention and in a conventional current sensor shown in FIG. 9. The current sensor in FIG. 1 arranges the magneto-electronic conversion element 13 outside the gap 12. The conventional current sensor in FIG. 9 arranges the magneto-electronic conversion element 13 inside the gap 12. A result is shown in FIG. 3. A width size W of the shield plate 12 in embodiments of the present invention is the same as a width size W of the shield plate 12 in a conventional example.

As shown in FIG. 3, in the current sensor for using the magneto-electronic conversion element 13, the magnetic flux density is saturated in the arranging position of the magneto-electronic conversion element 13 when a current passed through the bus bar 11 increases. Thereby, an output of the current sensor cannot maintain linearity, and the measurement error becomes large. As is clear by comparing the embodiments of the present invention and the conventional example, in case the width size W is identical, the current sensor of embodiments of the present invention do not magnetically-saturate and the measurement error does not increase even if the current sensor of the present invention passes a current larger than a current passed into the conventional current sensor. Thereby, the current sensor of the present invention can measure a widespread current.

Inventors manufacture the current sensor having the shield plate 12 of a various size L (FIG. 1) in Y-axis direction, and investigated a relation between the size L of the shield plate 12 in Y-axis direction and measurement error of the current sensor. A result is shown in FIG. 4. As is clear in FIG. 4, in case a same current flows into the bus bar 11, when the size L of the shield plate 12 is small, the magnetic flux density in the arranging position of the magneto-electronic conversion element 13 is saturated. Consequently, measurement error occurs. On the other hand, according to increasing the size L, it was noticed that the magnetic flux density in the arranging position of the magneto-electronic conversion element 13 is hard to be saturated.

More specifically, the magnetic-saturation in the arranging position of the magneto-electronic conversion element 13 at the current sensor of embodiments of the present invention depends on the size L in Y-axis direction of the flow direction of a current regardless of the width size W of the shield plate 12. Therefore, according to the current sensor of embodiments, effects of the magnetic-saturation can decrease easy by increasing the size L in Y-axis direction without increasing the width size W of the shield plate 12 like a conventional way. For this reason, compared to conventional, the current sensor of the present invention can reduce costs by reducing a volume of the shield plate 12 and by simplifying a shape of the shield plate 12 (Lamination and winding of the shield plate 12 are not required).

According to the above mentioned current sensor, the gap 12A is arranged in the shield plate 12 along a Y-axis direction. Therefore, the current sensor can prevent the shield plate 12 from being magnetically-saturated by a small current, and measure a current in further extensive range.

According to the above embodiments, a gap width WG (FIG. 1) of the gap 12A arranged in the shield plate 12 is arranged in the current sensor but not limited thereto. For example, as shown in FIG. 5, the shield plate 12 which a width of the gap 12A is increased in one part can be used for holding a route which removes a signal of magneto-electronic conversion element 13 to outside. However, for shielding influence on the magnetic field from outside, it is preferable that the gap width WG opposed to the magneto-electronic conversion element 13 is small.

Figure 6A:
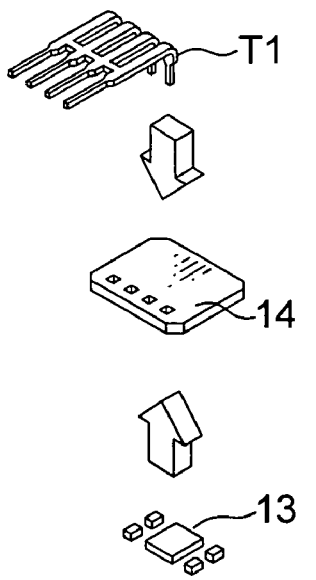
FIGS. 6A to 6F are an explanatory diagram showing a manufacturing process of a current sensor of waterproof connector type.
Figure 6B:
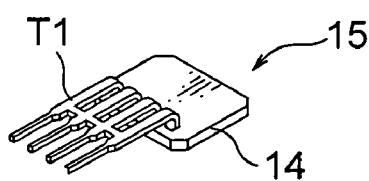
Figure 6C:
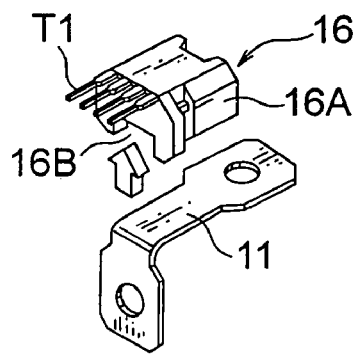
Figure 6D:
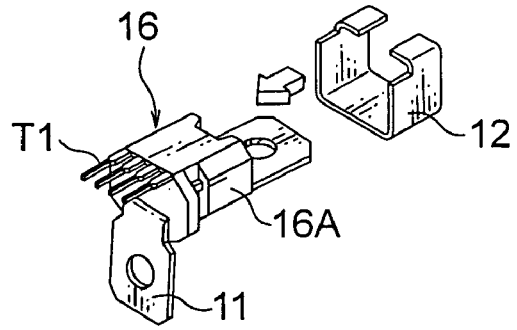
Figure 6E:
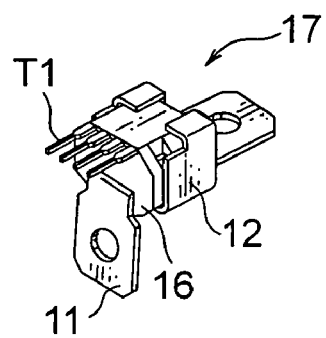
Figure 6F:
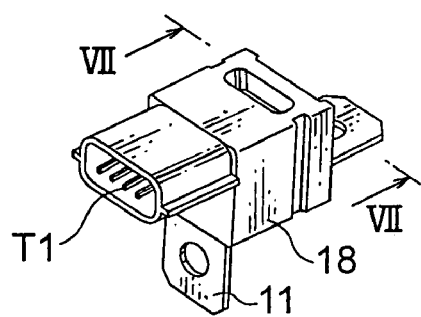
Figure 7A:
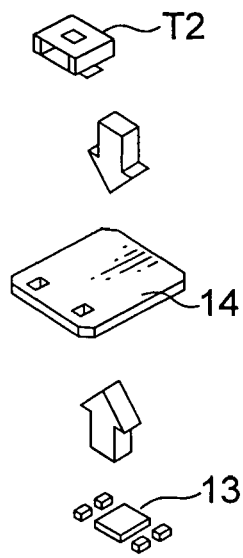
FIGS. 7A to 7F are an explanatory diagram showing a manufacturing process of a current sensor of FPC connector type.

Manufacturing process of the above mentioned current sensor is explained by referring to FIGS. 6A to 6F and FIGS. 7A to 7F. FIGS. 6A to 6F are an explanatory diagram showing manufacturing process of a current sensor of a waterproof connector type. FIGS. 7A to 7F are an explanatory diagram showing manufacturing process of a current sensor of a FPC (flexible printed circuits) connector type. As shown in FIGS. 6A and 7A, the magneto-electronic conversion element 13 is mounted on the wiring board 14.

Figure 7B:
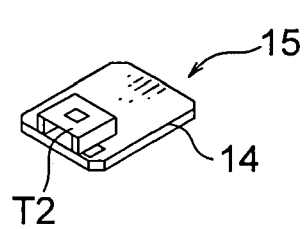
Figure 7C:
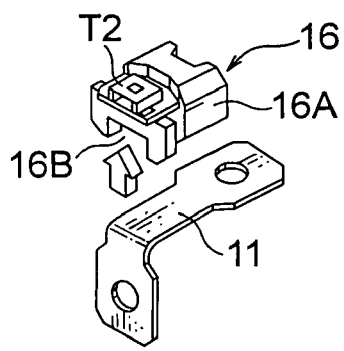

In the current sensor of the waterproof connector type, an output terminal T1 is mounted on the wiring board 14. In the current sensor of the FPC connector type, a FPC connector T2 is mounted on the wiring board 14. As shown in FIGS. 6B and 7B, a wiring board assembly 15 is molded. Next, in condition that the above wiring board assembly 15 is inserted in a die for a holder, a molding material is injected in the die for the holder. A holder 16, as shown in FIGS. 6C and 7C, is molded into transfer molding.

Figure 7D:
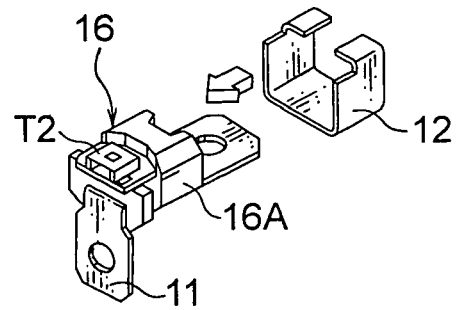
Figure 7E:
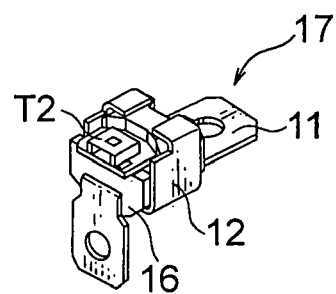

Thereby, the holder 16 seals and holds the wiring board assembly 15 inside. An outer side surface 16A and a pressing groove 16B are arranged in the holder 16. The outer side surface 16A is pressed in the shield plate 12. The pressing groove 16B presses in the bus bar 11 arranged in the outer side surface 16A. As shown in FIGS. 6C and 7C, the bus bar 11 is pressed in the pressing groove 16B arranged in the outer side surface 16A of the holder 16. Thereafter, as shown in FIGS. 6D and 7D, the outer side surface 16A of the holder 16 is pressed in the shield plate 12. As shown in FIGS. 6E and 7E, the holder assembly 17 is molded.

Figure 7F:
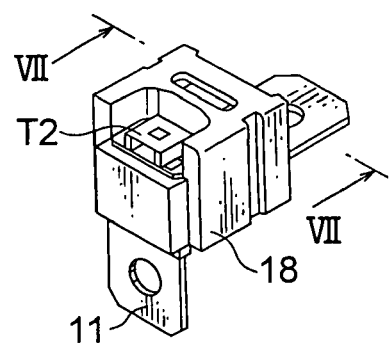

In condition that the holder assembly 17 is inserted in a die for a chassis, a resin of a molding material is injected into the die for the chassis. As shown in FIGS. 6F and 7F, a chassis 18 of a resin is molded, and completes.

Figure 8:
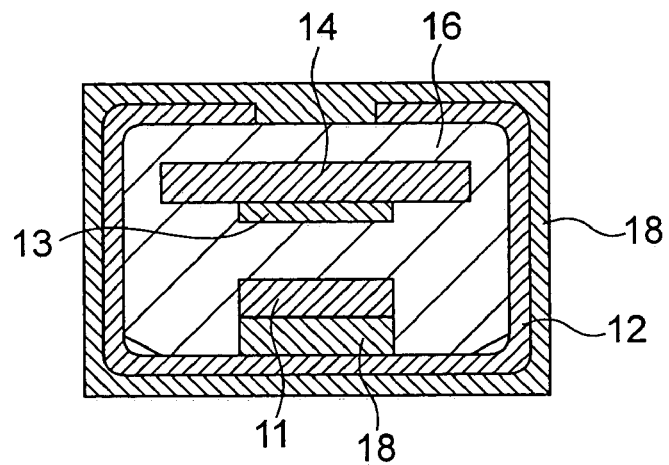
FIG. 8 is a cross-sectional view taken along the line VII-VII in FIG. 6G and FIG. 7G.

According to the above molding method, as shown in FIG. 8, the outer side surface of the shield plate 12, and between the shield plate 12 in the pressing groove 16B and the bus bar 11 are sealed by a resin chassis 18. Also, the magneto-electronic conversion element 13 is sealed by the holder 16 pressed in the shield plate 12. Consequently, the bus bar 11, the shield plate 12 and the magneto-electronic conversion element 13 can be held strongly into the resin chassis 18 with the easy molding method. Thereby, a position of the bus bar 11, the shield plate 12 and the magneto-electronic conversion element 13 can be prevented from moving, and a current can be measured accurately more.

According to the above embodiments, the gap 12A is arranged in the shield plate 12. The embodiments of the present invention are not limited thereto. The gap 12A does not need to arrange, but it is desirable to arrange the gap 12A so as to do magnetic-saturation soon when the gap 12 is not arranged.

According to the above embodiments, the bus bar 11, the magneto-electronic conversion element 13 and the gap 12A are arranged on Z-axis side by side, but the present invention is not limited thereto. The gap 12A does not require arranging on the Z-axis.

According to the above embodiments, the bus bar 11 of plate shape is used as a conductor, but the present invention is not limited thereto. A linear cable can be used as a conductor.

While the invention has been described with reference to specific embodiments, the description is illustrative and not to be construed as limiting the scope of the invention. That is to say, various changes and modifications can be made without departing from the scope of the invention as defined by the following claims.

What is claimed is:

1. A current sensor comprising:
a conductor through which a current flows;
a C-shaped shield plate made of metal and positioned around the conductor; and
a magneto-electronic conversion element for detecting magnetic flux density of a magnetic field which is generated when the current flows through the conductor and converting the magnetic flux density into an electric signal,
wherein the magneto-electronic conversion element is arranged near a position where the previously measured magnetic flux density of the magnetic field, which is generated when the current flows through the conductor, is minimized between the conductor and the shield plate.

2. The current sensor as claimed in claim 1, further comprising a wiring board on which the magneto-electronic conversion element is mounted, a holder sealing the wiring board and a chassis sealing the holder, wherein the holder includes an outer side surface pressed in the shield plate and a pressing groove arranged in the outer side surface such that the conductor is pressed into the pressing groove.

3. The current sensor as claimed in claim 1, wherein the shield plate includes a gap along the flow direction of the current.

4. The current sensor as claimed in claim 2, wherein the shield plate includes a gap along the flow direction of the current.

5. A molding method of a current sensor having a conductor through which a current flows, a C-shaped shield plate made of metal and positioned around the conductor, and a magneto-electronic conversion element for detecting magnetic flux density of a magnetic field which is generated when the current flows through the conductor and converting into an electric signal, comprising the steps of:

injecting a molding material into a die for a holder in condition that a wiring board on which the magneto-electronic conversion element is mounted is inserted in the die for the holder, and molding a holder sealing the wiring board;

pressing the conductor in a pressing groove arranged in an outer side surface of the holder, thereafter pressing the outer side surface of the holder in the shield plate, and molding a holder assembly; and injecting a molding material into a die for a chassis in condition that the holder assembly is inserted in the die for the chassis, and molding the chassis sealing the holder assembly.

* * * * *